United States Patent
Hashimoto et al.

(10) Patent No.: US 11,652,178 B2
(45) Date of Patent: May 16, 2023

(54) SOLAR CELL MODULE INCLUDING SOLAR CELLS

(71) Applicant: PANASONIC CORPORATION, Osaka (JP)

(72) Inventors: Haruhisa Hashimoto, Osaka (JP); Kenichi Maki, Osaka (JP)

(73) Assignee: PANASONIC HOLDINGS CORPORATION, Osaka (JP)

(*) Notice: Subject to any disclaimer, the term of this patent is extended or adjusted under 35 U.S.C. 154(b) by 189 days.

(21) Appl. No.: 16/725,927

(22) Filed: Dec. 23, 2019

(65) Prior Publication Data

US 2020/0212233 A1 Jul. 2, 2020

(30) Foreign Application Priority Data

Dec. 27, 2018 (JP) .............................. JP2018-245939

(51) Int. Cl.
*H01L 31/0224* (2006.01)
*H01L 31/02* (2006.01)
(Continued)

(52) U.S. Cl.
CPC .. *H01L 31/022425* (2013.01); *H01L 31/0201* (2013.01); *H01L 31/02013* (2013.01); *H01L 31/048* (2013.01); *H01L 31/0508* (2013.01); *H01L 31/0512* (2013.01); *H01L 23/488* (2013.01); *H01L 24/26* (2013.01);
(Continued)

(58) Field of Classification Search
CPC ......... H01L 31/022425; H01L 31/0201; H01L 31/02013; H01L 31/048; H01L 31/0508; H01L 31/0512; H01L 31/0504; H01L 31/042; H01L 23/488; H01L 24/26; H01L 31/022441; H01L 31/0516; H01L 33/507; H01L 33/62; H01L 33/644;
(Continued)

(56) References Cited

U.S. PATENT DOCUMENTS

2005/0241692 A1 11/2005 Rubin et al.
2007/0175509 A1 8/2007 Yagiura et al.
(Continued)

FOREIGN PATENT DOCUMENTS

EP 3163630 A1 5/2017
EP 3244454 A1 11/2017
(Continued)

OTHER PUBLICATIONS

Extended European Search Report issued in European Patent Application No. 19217829.1, dated Feb. 28, 2020.

*Primary Examiner* — Michael Y Sun
(74) *Attorney, Agent, or Firm* — McDermott Will and Emery LLP

(57) ABSTRACT

The finger electrode is formed by hard-soldered silver paste. The melting point of the first type solder layer provided on the surface of the terminal wiring member is higher than the melting point of the second type solder layer provided on the surface of the wire. The first width, in the first direction, of the second type solder layer in the first portion where the wire is connected to the terminal wiring member is larger than the second width, in the first direction, of the second type solder layer in the second portion where the wire is connected to the finger electrode.

22 Claims, 8 Drawing Sheets

(51) Int. Cl.
  *H01L 31/048* (2014.01)
  *H01L 31/05* (2014.01)
  *H01L 33/50* (2010.01)
  *H01L 33/62* (2010.01)
  *H01L 33/64* (2010.01)
  *H01L 23/488* (2006.01)
  *H01L 23/00* (2006.01)

(52) U.S. Cl.
  CPC .. *H01L 31/022441* (2013.01); *H01L 31/0516* (2013.01); *H01L 33/507* (2013.01); *H01L 33/62* (2013.01); *H01L 33/644* (2013.01); *H01L 2224/84801* (2013.01); *H01L 2224/85801* (2013.01); *H01L 2924/014* (2013.01)

(58) Field of Classification Search
  CPC . H01L 2224/84801; H01L 2224/85801; H01L 2924/014; Y02E 10/50
  See application file for complete search history.

(56) References Cited

U.S. PATENT DOCUMENTS

| | | | | |
|---|---|---|---|---|
| 2010/0146745 | A1* | 6/2010 | Cheng | A44B 18/0076 24/306 |
| 2011/0146745 | A1* | 6/2011 | Echizenya | H01L 31/0504 136/244 |
| 2011/0277835 | A1* | 11/2011 | Masson | H01L 31/022433 136/256 |
| 2012/0305048 | A1* | 12/2012 | Tsuruoka | H01L 31/022433 136/244 |
| 2013/0125974 | A1* | 5/2013 | Kong | H01L 31/022466 136/256 |
| 2015/0083187 | A1* | 3/2015 | Hashimoto | H01L 31/022433 136/244 |
| 2015/0372177 | A1 | 12/2015 | Kim et al. | |
| 2016/0093752 | A1* | 3/2016 | Kim | H01L 31/0504 136/244 |
| 2016/0172510 | A1* | 6/2016 | Bitnar | H01L 31/0684 136/244 |
| 2016/0308082 | A1 | 10/2016 | Ishii et al. | |
| 2017/0104114 | A1 | 4/2017 | Kim et al. | |
| 2017/0365731 | A1 | 12/2017 | Lin et al. | |
| 2019/0207045 | A1 | 7/2019 | Nakamura | |
| 2019/0288135 | A1 | 9/2019 | Kim et al. | |

FOREIGN PATENT DOCUMENTS

| | | |
|---|---|---|
| JP | 2007-235113 A | 9/2007 |
| JP | 2010-045402 A | 2/2010 |
| JP | 2016-005002 A | 1/2016 |
| WO | 2018/051658 A1 | 3/2018 |

\* cited by examiner

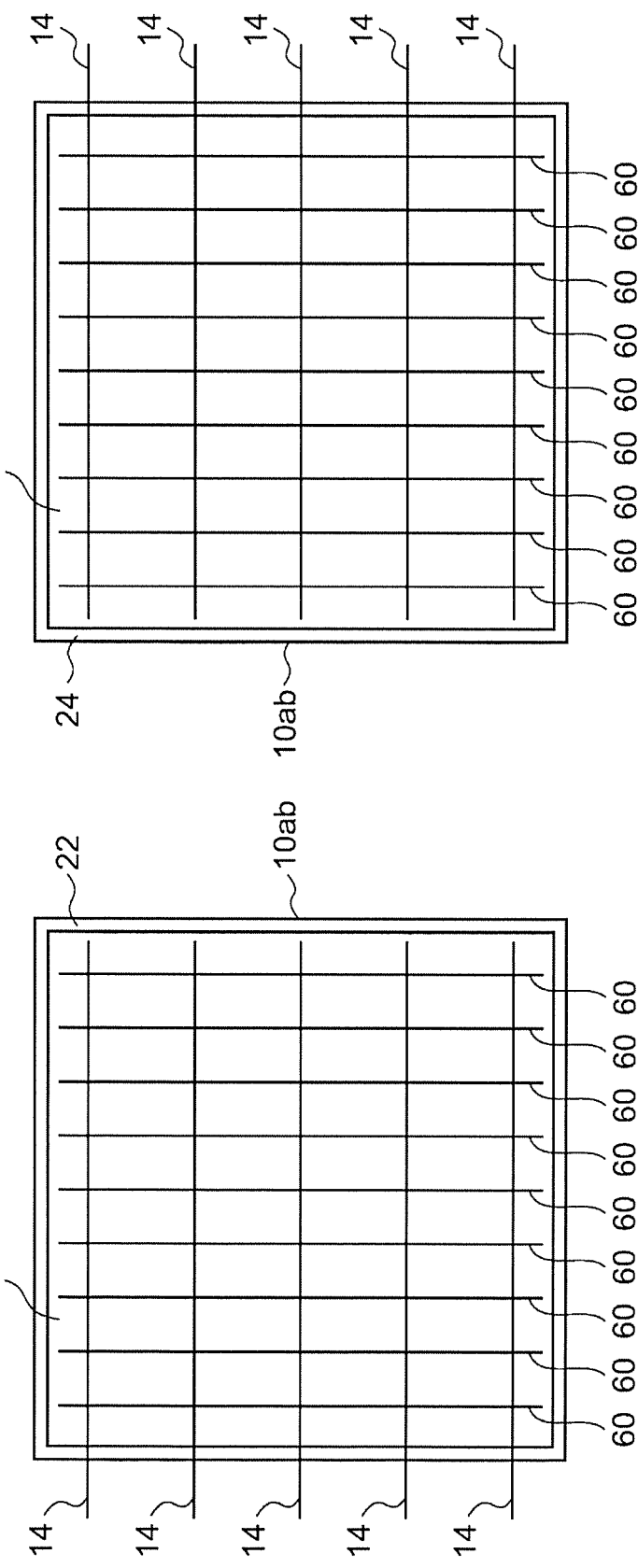

SOLAR CELL MODULE INCLUDING SOLAR CELLS

CROSS-REFERENCE TO RELATED APPLICATION

This application is based upon and claims the benefit of priority from the prior Japanese Patent Application No. 2018-245939, filed on Dec. 27, 2018, the entire contents of which are incorporated herein by reference.

BACKGROUND

1. Field

The disclosure relates to a solar cell module and, more particularly, to a solar cell module including solar cells.

2. Description of the Related Art

A film having a plurality of wires attached on one surface thereof is used to make it easy to manufacture a solar cell module. The area around the wire is coated by a solder having a low melting point. The film is layered on the solar cell such that the one surface faces the light receiving surface of the solar cell. Further, another film is layered on the solar cell such that the one surface faces the back surface of the solar cell. By heating the stack formed by the layering to a temperature higher than the melting point of the solder, the wires are connected to the solar cell (see, for example, JP2010-45402). The solar cell in which a plurality of wires are connected to each of the light receiving surface and the back surface is encapsulated by an encapsulant provided between a protection member on the light receiving surface side (hereinafter, referred to as "first protection member") and a protection member on the back surface side (hereinafter, referred to as "second protection member"). If the bond strength of the wires becomes poor in such a structure, the durability of the solar cell module is lowered.

SUMMARY

The present disclosure addresses the above-described issue, and a purpose thereof is to provide a technology capable of simplifying the manufacturing of a solar cell module and, at the same time, inhibiting the durability from being lowered.

A solar cell module according to an embodiment of the present disclosure includes: a solar cell including a first surface and a second surface that face in opposite directions, a plurality of collecting electrodes each extending in a first direction being arranged on the first surface in a second direction intersecting the first direction; a first type wiring member that extends in the first direction at a position more spaced apart from the solar cell in the second direction than an interval between two adjacent collecting electrodes in the second direction; a first protection member provided on a side of the first surface of the solar cell; a second protection member provided on a side of the second surface of the solar cell; an encapsulant provided between the first protection member and the second protection member to encapsulate the solar cell and the first type wiring member; a film attached to the first surface of the solar cell; and a second type wiring member that extends in the second direction so as to be connected to the plurality of collecting electrodes such that the second type wiring member is sandwiched by the film and the first surface and to be also connected to the first type wiring member. Each of the collecting electrodes is formed by hard-soldered silver paste, a melting point of a first type solder provided on a surface of the first type wiring member is higher than a melting point of a second type solder provided on a surface of the second type wiring member, and a first width, in the first direction, of the second type solder in a first portion where the second type wiring member is connected to the first type wiring member is larger than a second width, in the first direction, of the second type solder in a second portion where the second type wiring member is connected to the collecting electrode.

BRIEF DESCRIPTION OF THE DRAWINGS

The figures depict one or more implementations in accordance with the present teaching, by way of example only, not by way of limitations. In the figures, like reference numerals refer to the same or similar elements.

FIGS. 6A and 6B are plan views showing a structure of the solar cell of FIG. 1;

DETAILED DESCRIPTION

Figure 1:
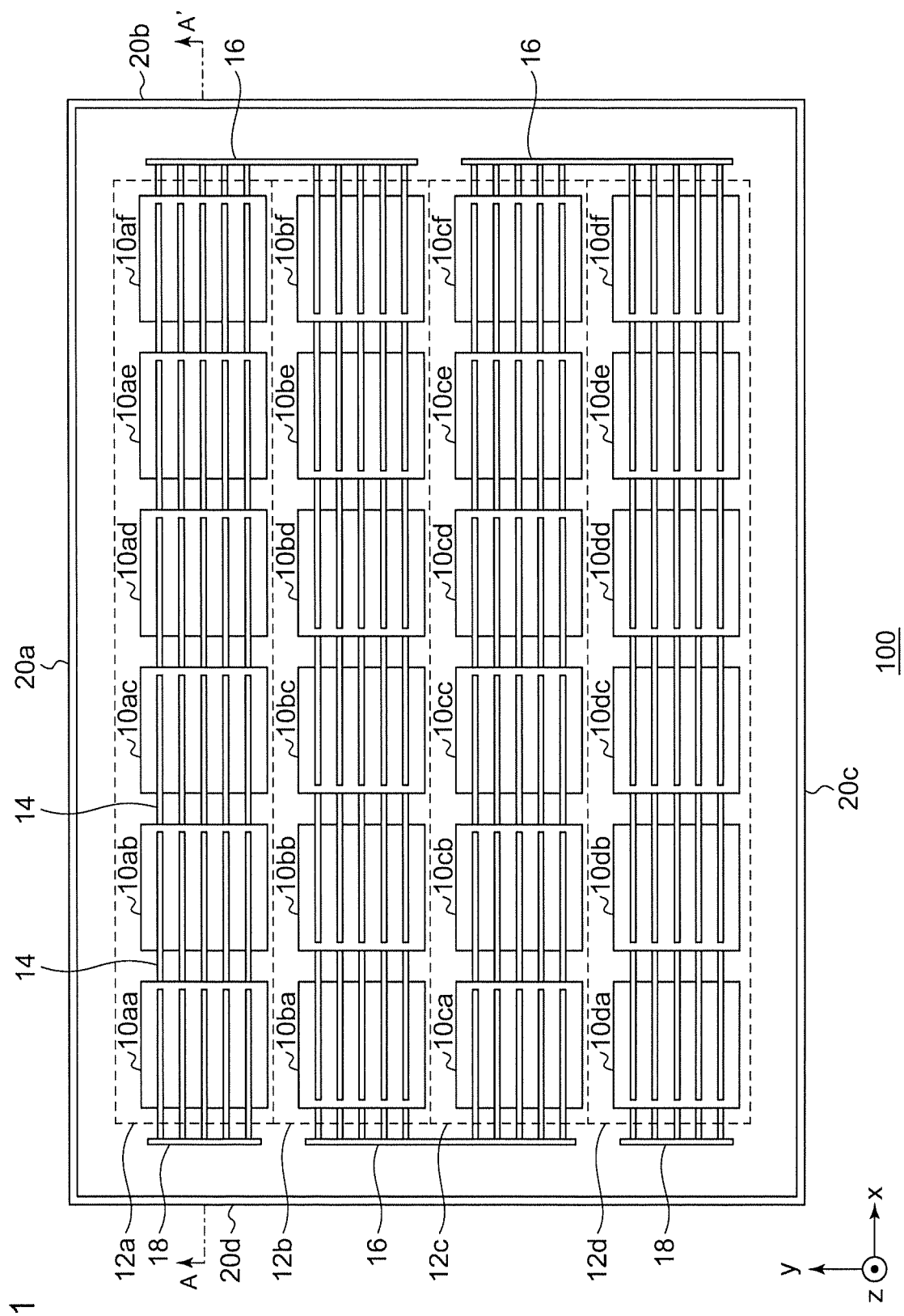
FIG. 1 is a plan view showing a structure of a solar cell module according to the embodiment.

The invention will now be described by reference to the preferred embodiments. This does not intend to limit the scope of the present invention, but to exemplify the invention.

A brief summary will be given before describing the present disclosure in specific details. An embodiment of the present disclosure relates to a solar cell module in which a plurality of solar cells are arranged in a matrix. An encapsulant is provided between the first protection member and the second protection member in the solar cell module. The encapsulant encapsulates a plurality of solar cell. In this process, two adjacent solar cells are connected by a wire film. A wire film is configured as two films connected by a plurality of wires, and the respective films are adhesively attached to adjacent solar cells, thereby connecting the finger electrodes of the respective solar cells by the plurality of wires. Since the wire plays the role of a wiring member, a string is formed by a plurality of solar cells arranged in a direction of extension of the wire. A wire film like this is used to make it easy to manufacture a solar cell module.

One of these two films (hereinafter, referred to as "first film") is attached to the light receiving surface of one solar cell, and the other of the two films (hereinafter, referred to as "second film") is attached to the back surface of the adjacent solar cell. Thus, by using a wire film in a solar cell module in which the first protection member, the encapsulant, and the second protection member are arranged in the direction away from the light receiving surface side toward the back surface side, the first film, the solar cell, and the second film are arranged in the encapsulant in that direction.

To describe the connection of solar cells in further details, each of the light receiving surface and the back surface of a solar cell is formed by a transparent electrode. A plurality of finger electrodes each formed by hard-soldered silver paste and extending in the first direction are arranged in the second direction. A plurality of such solar cells are arranged in the second direction and connected by a plurality of wires extending in the second direction, thereby forming a string extending in the second direction. Further, a plurality of strings are arranged in the first direction. The solar cells provided at the respective ends of two adjacent strings are connected by a bridge wiring member extending in the first direction. As a result, a plurality of strings are connected.

Improvement in the durability of such a solar cell module, in which a wire film is used, requires improvement in the bond strength of wires. A solder having a low melting point is provided on the surface of a wire. As the solder is melted, the wire connects a plurality of solar cells or connects the solar cell and the bridge wiring member. The wettability of the finger electrode, in which hard-soldered silver paste is used, with a solder of a low melting point is higher than the wettability of the transparent electrode. Therefore, the solder of a low melting point on the transparent electrode is attracted to the finger electrode having a higher wettability as the solder of a low melting point is melted.

In this embodiment, a solder of a high melting point is provided on the surface of the bridge wiring member, and the interval between the bridge wiring member and the solar cell in the second direction is configured to be longer than the interval between finger electrodes adjacent on the solar cell in the second direction. The wettability of the bridge wiring member, in which the solder of a high melting point is used, with the solder of a low melting point is higher than the wettability of the finger electrode in which hard-soldered silver paste is used. For this reason, the solder of a low melting point is more attracted to the bridge wiring member than the finger electrode, as the solder of a low melting point is melted. As a result, the width of the solder of a low melting point in the first direction will be largest in the bridge wiring member, followed by the finger electrode and the transparent electrode in the stated order. This improves the bond strength of the wire in the bridge wiring member and in the finger electrode. The terms "parallel" and "perpendicular" in the following description not only encompass completely parallel or perpendicular but also encompass off-parallel and off-perpendicular within the margin of error. The term "substantially" means identical within certain limits.

FIG. 1 is a plan view showing a structure of a solar cell module 100. As shown in FIG. 1, an orthogonal coordinate system including an x axis, y axis, and a z axis is defined. The x axis and y axis are orthogonal to each other in the plane of the solar cell module 100. The z axis is perpendicular to the x axis and y axis and extends in the direction of thickness of the solar cell module 100. The positive directions of the x axis, y axis, and z axis are defined in the directions of arrows in FIG. 1, and the negative directions are defined in the directions opposite to those of the arrows. Of the two principal surfaces forming the solar cell module 100 that are parallel to the x-y plane, the principal surface disposed on the positive direction side along the z axis is the light receiving surface, and the principal surface disposed on the negative direction side along the z axis is the back surface. Hereinafter, the positive direction side along the z axis will be referred to as "light receiving surface side" and the negative direction side along the z axis will be referred to as "back surface side". When the y axis direction is referred to as the "first direction", the x axis direction is referred to as the "second direction". FIG. 1 can be said to be a plan view of the solar cell module 100 as viewed from the light receiving surface side.

The solar cell module 100 includes an 11th solar cell 10aa, . . . , a 46th solar cell 10df, which are generically referred to as solar cells 10, wires 14, bridge wiring members 16, terminal wiring members 18, a first frame 20a, a second frame 20b, a third frame 20c, and a fourth frame 20d, which are generically referred to as frames 20.

The first frame 20a extends in the x axis direction, and the second frame 20b extends in the negative direction along the y axis from the positive direction end of the first frame 20a along the x axis. Further, the third frame 20c extends in the negative direction along the x axis from the negative direction end of the second frame 20b along the y axis, and the fourth frame 20d connects the negative direction end of the third frame 20c along the x axis and the negative direction end of the first frame 20a along the x axis. The frames 20 bound the outer circumference of the solar cell module 100 and are made of a metal such as aluminum. The first frame 20a and the third frame 20c are longer than the second frame 20b and the fourth frame 20d, respectively, so that the solar cell module 100 has a rectangular shape longer in the x axis direction than in the y axis direction. The shape of the solar cell module 100 is not limited to the illustrated shape.

Each of the plurality of solar cells 10 absorbs incident light and generates photovoltaic power. In particular, the solar cell 10 generates an electromotive force from the light absorbed on the light receiving surface and also generates photovoltaic power from the light absorbed on the back surface. The solar cell 10 is formed by, for example, a semiconductor material such as crystalline silicon, gallium arsenide (GaAs), or indium phosphorus (InP). The structure of the solar cell 10 is not limited to any particular type. It is assumed here that crystalline silicon and amorphous silicon are stacked by way of example. The solar cell 10 is formed in a rectangular shape on the x-y plane but may have other shapes. For example, the solar cell 10 may have an octagonal shape. A plurality of finger electrodes (not shown in FIG. 1) extending in the y axis direction in a mutually parallel manner are disposed on the light receiving surface and the back surface of each solar cell 10. The finger electrode is a collecting electrode.

The plurality of solar cells 10 are arranged in a matrix on the x-y plane. In this case, six solar cells 10 are arranged in the x axis direction. The six solar cells 10 arranged and disposed in the x axis direction are connected in series by the wires 14 so as to form one string 12. For example, a first string 12a is formed by connecting the 11th solar cell 10aa, the 12th solar cell 10ab, . . . , and the 16th solar cell 10af. The second string 12b through the fourth string 12d are similarly formed. As a result, the four strings 12 are arranged in parallel in the y axis direction. In this case, the number of solar cells 10 arranged in the x axis direction is larger than the number of solar cells 10 arranged in the y axis direction. The number of solar cells 10 included in the string 12 is not limited to "6", and the number of strings 12 is not limited to "4".

In order to form the string 12, the wires 14 connect the finger electrodes on the light receiving surface side of one of the solar cells 10 adjacent to each other in the x axis direction to the finger electrodes on the back surface side of the other. For example, the five wires 14 for connecting the 11th solar cell 10aa and the 12th solar cell 10ab adjacent to each other electrically connect the finger electrodes on the back surface side of the 11th solar cell 10aa and the finger electrodes on the light receiving surface side of the 12th solar cell 10ab. The number of wires 14 is not limited to "5". Connection between the wires 14 and the solar cell 10 will be described below.

The bridge wiring member 16 extends in the y axis direction and electrically connect the two adjacent strings 12. For example, the 16th solar cell 10af located at the positive direction end of the first string 12a along the x axis and the 26th solar cell 10bf located at the positive direction end of the second string 12b along the x axis are electrically connected by the bridge wiring member 16. Further, the second string 12b and the third string 12c are electrically connected by the bridge wiring member 16 at the negative direction end along the x axis, and the third string 12c and the fourth string 12d are electrically connected by the bridge wiring member 16 at the positive direction end along the x axis. As a result, the plurality of strings 12 are connected in series by the bridge wiring member 16.

The bridge wiring member 16 is not connected to the 11th solar cell 10aa at the negative direction end of the first string 12a along the x axis. Instead the terminal wiring member 18 is connected. The terminal wiring member 18 is also connected to the 41st solar cell 10da at the negative direction end of the fourth string 12d along the x axis. A lead wiring member (not shown) is connected to the terminal wiring member 18. The lead wiring member is a wiring member for retrieving the electric power generated in the plurality of solar cells 10 outside the solar cell module 100. Given that the bridge wiring member 16 and the terminal wiring member 18 are referred to as "first type wiring member", the wire 14 is referred to as "second type wiring member".

Figure 2:
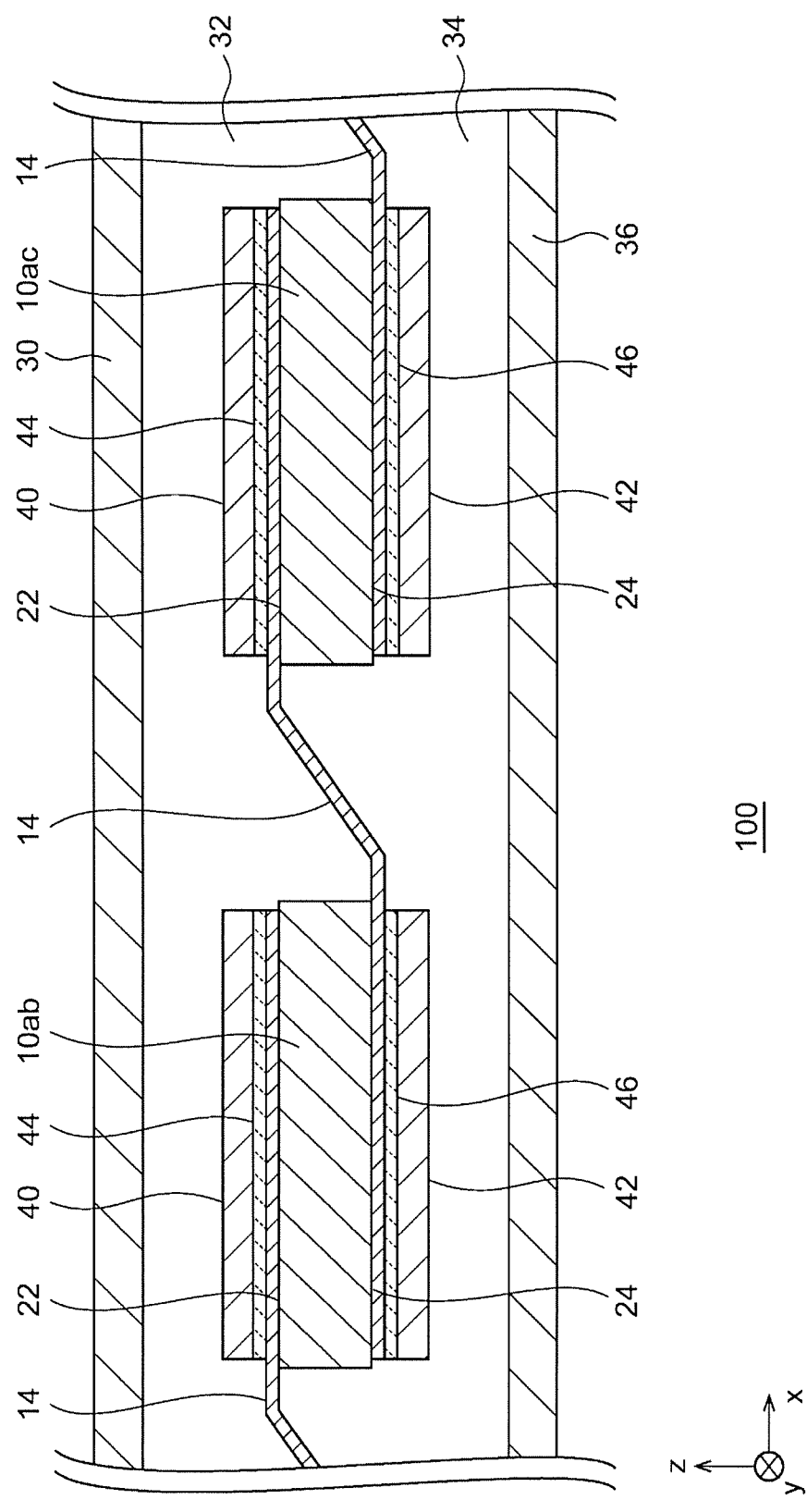
FIG. 2 is a cross-sectional view showing a structure of the solar cell module of FIG. 1.

FIG. 2 is a cross sectional view showing a structure of the solar cell module 100 along the x axis and is an A-A cross sectional view of FIG. 1. The solar cell module 100 includes a 12th solar cell 10ab, a 13th solar cell 10ac, the wires 14, a first protection member 30, a first encapsulant 32, a second encapsulant 34, a second protection member 36, a first film 40, a second film 42, a first adhesive agent 44, and a second adhesive agent 46. The top of FIG. 2 corresponds to the light receiving surface side, and the bottom corresponds to the back surface side.

The first protection member 30 is disposed on the light receiving surface side of the solar cell module 100 and protects the surface of the solar cell module 100. Further, the solar cell module 100 is shaped in a rectangle bounded by the frames 20 on the x-y plane. The first protection member 30 is formed by using a translucent and water shielding glass, translucent plastic, etc. The first protection member 30 increases the mechanical strength of the solar cell module 100.

The first encapsulant 32 is stacked on the back surface side of the first protection member 30. The first encapsulant 32 is disposed between the first protection member 30 and the solar cell 10 and adhesively bonds the first protection member 30 and the solar cell 10. For example, a thermoplastic resin film of polyolefin, ethylene-vinyl acetate copolymer (EVA), polyvinyl butyral (PVB), polyimide, or the like may be used as the first encapsulant 32. A thermosetting resin may alternatively be used. The first encapsulant 32 is formed by a translucent sheet member having a surface of substantially the same dimension as the x-y plane in the first protection member 30.

Figure 3:
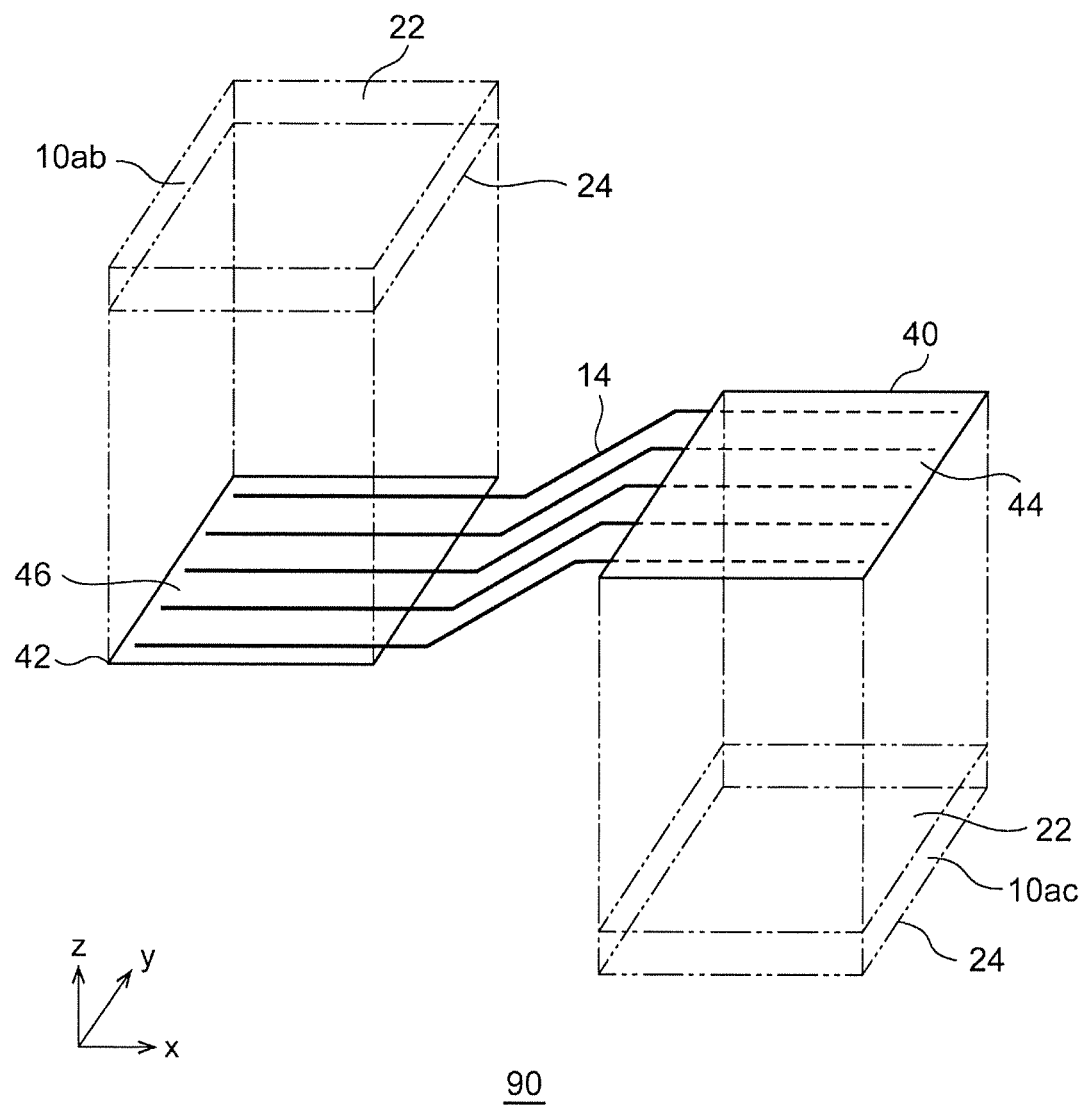
FIG. 3 is a perspective view showing a structure of a wire film used in the solar cell module of FIG. 2.

The 12th solar cell 10ab and the 13th solar cell 10ac are stacked on the back surface side of the first protection member 30. The solar cells 10 are provided such that the light receiving surface 22 faces the positive direction side along the z axis and the back surface 24 faces the negative direction side along the z axis. Given that the light receiving surface 22 is referred to as the "first surface", the back surface 24 is referred to as the "second surface". The wires 14, the first adhesive agent 44, and the first film 40 are provided on the light receiving surface 22 of the solar cell 10, and the wires 14, the second adhesive agent 46, and the second film 42 are provided on the back surface 24 of the solar cell 10. FIG. 3 will be used to describe the arrangement of the wires 14, the first film 40, and the second film 42 in the solar cell 10.

FIG. 3 is a perspective view showing a structure of a wire film 90 used in the solar cell module 100. The wire film 90 includes the wires 14, the first film 40, the second film 42, the first adhesive agent 44, and the second adhesive agent 46. The first film 40 is provided on the side of the light receiving surface 22 of one of the two adjacent solar cells 10 (for example, the 13th solar cell 10ac). The first adhesive agent 44 is provided on the surface of the first film 40 toward the 13th solar cell 10ac, and a plurality of wires 14 are provided on the first adhesive agent 44. The first adhesive agent 44 can adhesively bond the first film 40 to the light receiving surface 22 of the 13th solar cell 10ac.

The second film 42 is provided on the side of the back surface 24 of the other of the two adjacent solar cells 10 (for example, the 12th solar cell 10ab). The second adhesive agent 46 is provided on the surface of the second film 42 toward the 12th solar cell 10ab, and a plurality of wires 14 are provided on the second adhesive agent 46. The second adhesive agent 46 can adhesively bond the second film 42 to the back surface 24 of the 12th solar cell 10ab.

The wire film 90 configured as described above and the solar cell module 100 are manufactured separately. When the solar cell module 100 is manufactured, the first adhesive agent 44 is adhesively bonded to the light receiving surface 22 of the 13th solar cell 10ac, and the second adhesive agent 46 is adhesively bonded to the back surface 24 of the 12th solar cell 10ab. By adhesive bonding as described above, the wires 14 electrically connect the finger electrodes (not shown) on the light receiving surface 22 of the 13th solar cell 10ac to the finger electrodes (not shown) on the back surface 24 of the 12th solar cell 10ab.

Figure 4:
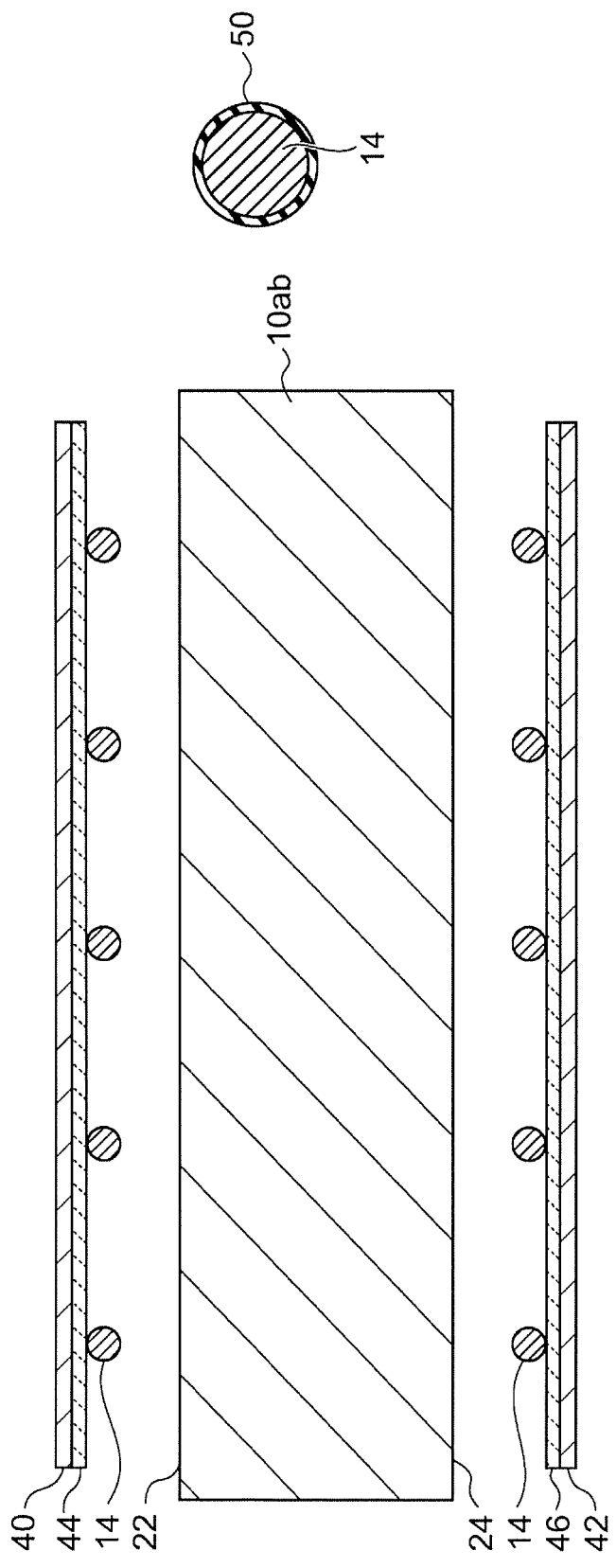
FIGS. 4A and 4B are cross-sectional views showing a structure of the first film and the second film exhibited before they are attached to the solar cell of FIG. 2.

The structure of the first film 40 and the second film 42 shown in FIG. 3 will be described in further detail. FIGS. 4A-4B are cross-sectional views showing a structure of the first film 40 and the second film 42 exhibited before they are attached to the solar cell 10. In particular, FIG. 4A is a cross-sectional view exhibited when the neighborhood of the 12th solar cell 10ab of FIG. 2 is severed along the y axis and is a cross-sectional view exhibited before the first film 40 and the second film 42 are attached to the 12th solar cell 10ab. As shown in FIG. 2, the first film 40 and the second film 42 shown in FIG. 4A are included in mutually different wire films 90.

The first film 40 is formed by a transparent resin film of, for example, polyethylene terephthalate (PET). The first film 40 has rectangular shape of a size equal to or smaller than the size of the solar cell 10 on the x-y plane. For example, polyolefin is used for the first adhesive agent 44 provided on the back surface side of the first film 40, but EVA may be used. The first adhesive agent 44 has a shape similar to that of the first film 40 on the x-y plane. A plurality of wires 14 are provided on the back surface side of the first adhesive agent 44.

FIG. 4B is a cross-sectional view of the wire 14 in the same direction as that of FIG. 4A. The wire 14 extends in a cylindrical shape and has a circular cross section. The wire 14 has a diameter of 100-500 μm, and, preferably, 300 μm, and so is thinner in width of 1-2 mm of a tab line commonly used in a solar cell module. The outer circumference of the wire 14 is coated with a second type solder layer 50 having a thickness of 5 μm to 30 μm. The second type solder layer 50 is formed by a solder having a low melting point. For example, the solder has a tin-silver-bismuth composition. In that case, the melting point of the second type solder layer 50 would be about 140° C. Reference is made back to FIG. 4A. The figure shows five wires 14 by way of example, but, generally, the number of wires 14 is 10-20, which is larger than the number of tab lines commonly used in a solar cell module.

The second film 42 is configured in a manner similar to that of the first film 40. As in the first adhesive agent 44, polyolefin or EVA is used for the second adhesive agent 46 provided on the light receiving side of the second film 42. The second adhesive agent 46 has a shape similar to that of the second film 42 on the x-y plane. A plurality of wires 14 are provided on the light receiving surface side of the second adhesive agent 46. The structure of the wire 14 is as shown in FIG. 4B. Reference is mad back to FIG. 2.

By bonding the first film 40 and the second film 42 to the other solar cells 10, the string 12 as shown in FIG. 1 is formed. The second encapsulant 34 is stacked on the back surface side of the first encapsulant 32. The second encapsulant 34 encapsulates the plurality of solar cells 10, the wires 14, the bridge wiring members 16, the terminal wiring members 18, the first films 40, the second films 42, etc., sandwiching the cells, the wires, the members, and the films between the first encapsulant 32 and the second encapsulant 34. The same member as used for the first encapsulant 32 may be used for the second encapsulant 34. The second encapsulant 34 is integrated with the first encapsulant 32 by heating the encapsulants in a laminate cure process.

The second protection member 36 is stacked on the back surface side of the second encapsulant 34 so as to face the first protection member 30. The second protection member 36 protects the back surface side of the solar cell module 100 as a back sheet. A resin film of, for example, PET, polytetrafluoroethylene (PTFE), etc., a stack film having a structure in which an Al foil is sandwiched by resin films of, for example, polyolefin, or the like is used as the second protection member 36.

Figure 5:
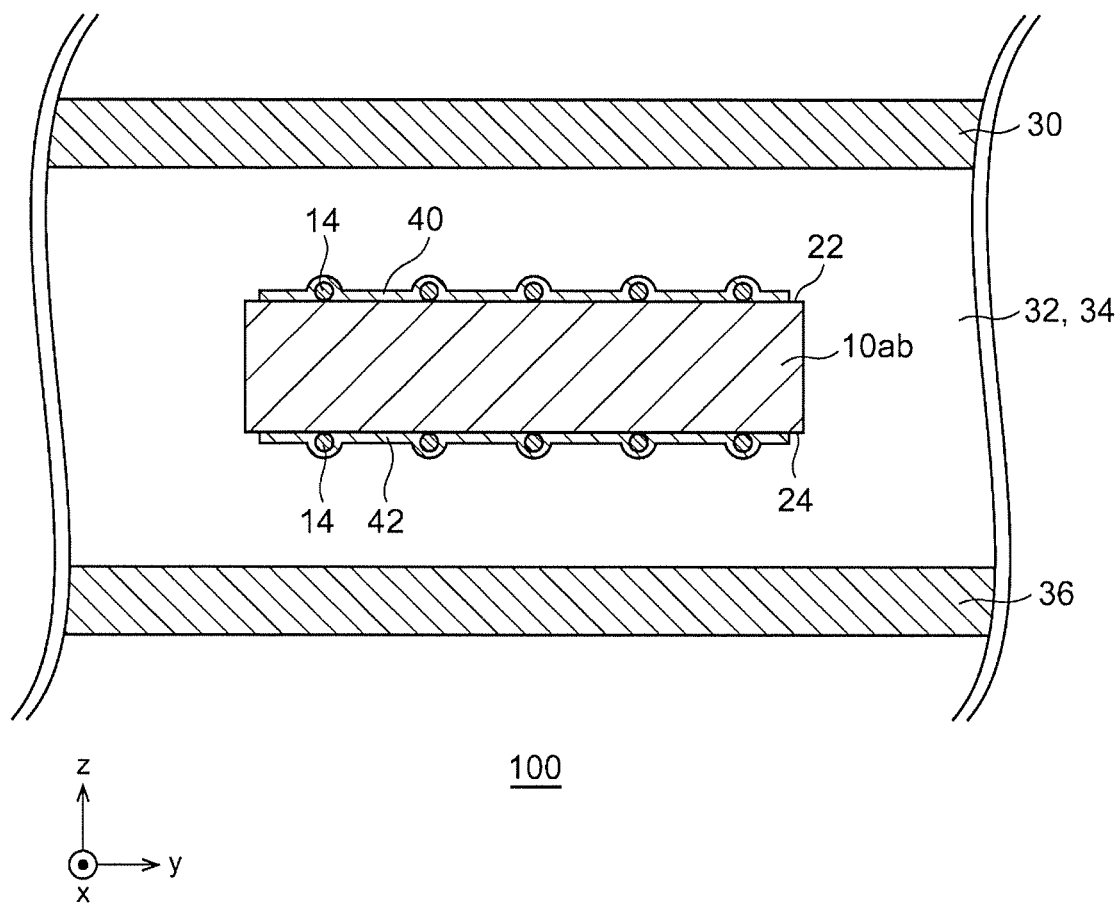
FIG. 5 is a partial cross-sectional view showing a structure of the solar cell module of FIG. 2.

FIG. 5 is a partial cross-sectional view showing a structure of the solar cell module 100 viewed in the same direction as FIG. 4A. The first protection member 30 is provided on the side of the light receiving surface 22 of the 12th solar cell 10*ab*, and the second protection member 36 is provided on the side of the back surface 24 of the 12th solar cell 10*ab*. The first encapsulant 32 and the second encapsulant 34 are integrated in a laminate cure process. The integrated encapsulant is provided between the first protection member 30 and the second protection member 36 to encapsulate a plurality of solar cells 10 including the 12th solar cell 10*ab*, the bridge wiring members 16 (not shown) or the terminal wiring members 18 (not shown).

The first film 40 is attached to the light receiving surface 22 of the 12th solar cell 10*ab* by being bonded by the first adhesive agent 44 of FIG. 4A. The plurality of wires 14 are sandwiched between the first film 40 and the light receiving surface 22, and the plurality of wires 14 are connected to the plurality of finger electrodes (not shown) on the light receiving surface 22 of the 12th solar cell 10*ab*. The second film 42 is attached to the back surface 24 of the 12th solar cell 10*ab* by being bonded by the second adhesive agent 46 of FIG. 4A. The plurality of wires 14 are sandwiched between the second film 42 and the back surface 24, and the plurality of wires 14 are connected to the plurality of finger electrodes (not shown) on the back surface 24 of the 12th solar cell 10*ab*. The plurality of wires 14 and the plurality of finger electrodes on the light receiving surface 22 of the 12th solar cell 10*ab* may not be connected by the melting of the second type solder layer 50, and the second type solder layer 50 and the finger electrodes may be directly in contact.

FIGS. 6A-6B are plan views showing a structure of the solar cell 10. FIG. 6A is a plan view showing the 12th solar cell 10*ab* of FIG. 5A as viewed from the side of the light receiving surface 22. A plurality of finger electrodes 60 extending in the y axis direction are arranged in the x axis direction on the light receiving surface 22. The plurality of wires 14 extend on the light receiving surface 22 from the negative direction side along the x axis so as to intersect the plurality of finger electrodes 60. The plurality of wires 14 are sandwiched between the first film 40 and the light receiving surface 22. The first film 40 is configured to be smaller than the light receiving surface 22. FIG. 6B is a plan view of the 12th solar cell 10*ab* of FIG. 5A viewed from the side of the back surface 24. A plurality of finger electrodes 60 extending in the y axis direction are arranged in the x axis direction on the back surface 24. The number of finger electrodes 60 on the back surface 24 may be larger than the number of finger electrodes 60 on the light receiving surface 22. In that case, the interval between adjacent finger electrodes 60 on the back surface 24 is configured to be smaller than the interval between adjacent finger electrodes 60 on the light receiving surface 22. The plurality of wires 14 extend on the light receiving surface 22 from the positive direction side along the x axis so as to intersect the plurality of finger electrodes 60. The plurality of wires 14 are sandwiched between the second film 42 and the back surface 24. The second film 42 is configured to be smaller than the back surface 24.

Figure 7A:
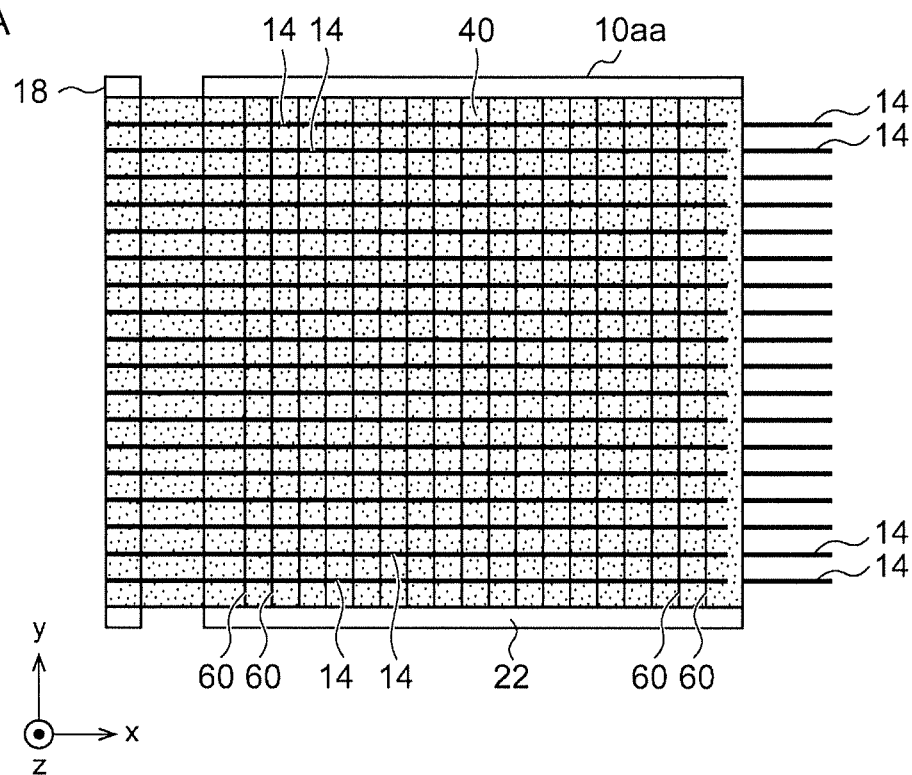
FIGS. 7A and 7B are partial plan views showing a structure of the solar cell module of FIG. 1.
Figure 7B:
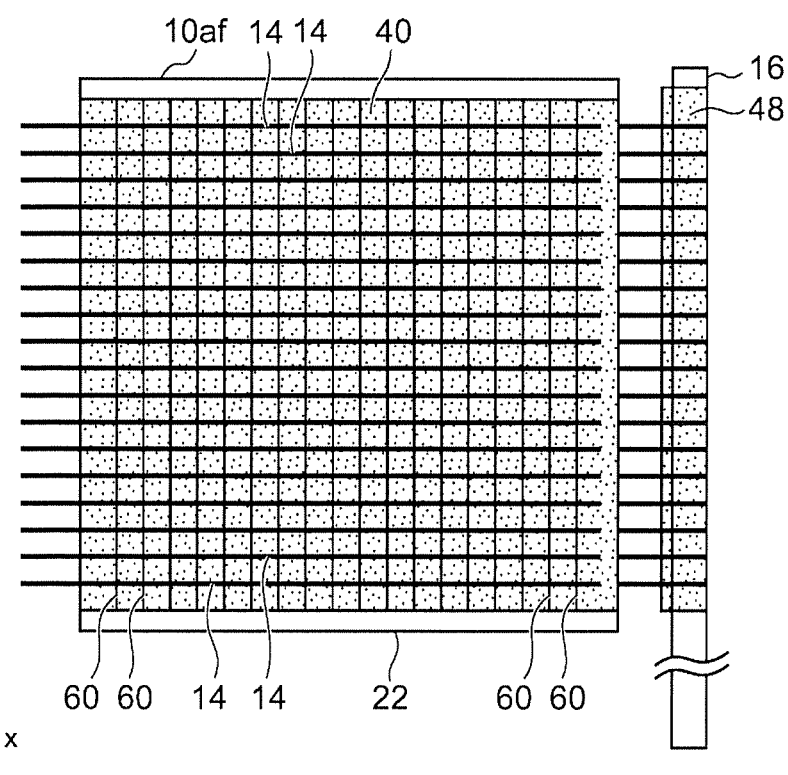

A description will now be given of the solar cell 10 provided at the end of the string 12. The solar cell 10 can be said to be a solar cell 10 adjacent to the bridge wiring member 16 or the terminal wiring member 18. FIGS. 7A-7B are partial plan views showing a structure of the solar cell module 100. FIG. 7A shows the neighborhood of the 11-th solar cell 10*aa* and the terminal wiring member 18 of FIG. 1. As mentioned above, a plurality of finger electrodes 60 each extending in the y axis direction are arranged in the x axis direction on the light receiving surface 22 of the 11-th solar cell 10*aa*. Further, a plurality of wires 14 each extending in the x axis direction are arranged in the y axis direction and are connected to the plurality of finger electrodes 60, respectively. By way of one example, the number of wires 14 is configured to be larger than that described above. These wires 14 are attached to the first film 40.

In this structure, the plurality of wires 14 and the first film 40 extend from the light receiving surface 22 of the 11-th solar cell 10*aa* in the negative direction along the x axis as far as a position overlapping the surface of the terminal wiring member 18 on the light receiving surface side. The plurality of wires 14 are connected there to the surface of the terminal wiring member 18 on the light receiving surface side, being sandwiched by the first film 40 and the terminal wiring member 18. The connection of the 31-st solar cell 10*ca* and the bridge wiring member 16 in FIG. 1 is of the same structure as that of FIG. 7A. The connection of the 26-th solar cell 10*bf* and the bridge wiring member 16 and the connection of the 46-th solar cell 10*df* and the bridge wiring member 16 in FIG. 1 are a horizontally flipped image of the structure of FIG. 7A.

FIG. 7B shows the neighborhood of the 16-th solar cell 10*af* and the bridge wiring member 16 of FIG. 1. On the light receiving surface 22 of the 16-th solar cell 10*af*, the plurality of finger electrodes 60, the plurality of wires 14, and the first film 40 are arranged in a manner similar to that of FIG. 7A. In this structure, the plurality of first films 40 from the back surface 24 of the 16-th solar cell 10*af* extend in the positive direction along the x axis as far as a position overlapping the surface of the bridge wiring member 16 on the light receiving surface side. Thus, the plurality of wires 14 are connected there to the surface of the bridge wiring member 16 on the light receiving surface side, being sandwiched by the film 48 and the bridge wiring member 16. The film 48 has a structure similar to that of the first film 40 and has a size commensurate with the bridge wiring member 16. The connection of the 36-th solar cell 10*cf* and the bridge wiring member 16 in FIG. 1 is of the same structure as that of FIG. 7B. The connection of the 21-th solar cell 10*ba* and the bridge wiring member 16 and the connection of the 41-st solar cell 10*da* and the terminal wiring member 18 in FIG. 1 are a horizontally flipped image of the structure of FIG. 7B.

Figure 8A:
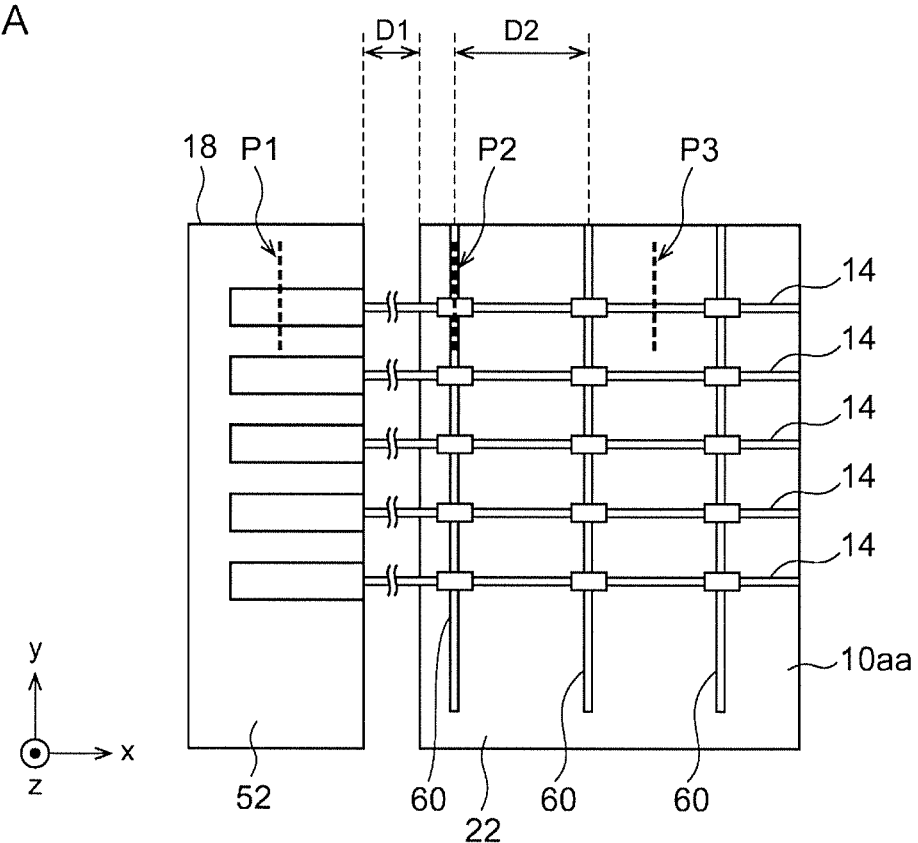
FIGS. 8A, 8B, 8C, and 8D show a structure of the second type solder layer in the solar cell module of FIG. 1.

FIGS. 8A-8D show a structure of the second type solder layer 50 in the solar cell module 100. FIG. 8A shows the neighborhood of the 11-st solar cell 10*aa* and the terminal wiring member 18 like that of FIG. 7*a* but is an enlarged view of a portion of the 11-st solar cell 10*aa* and the terminal wiring member 18. The first film 40 is omitted from the illustration. The light receiving surface 22 of the solar cell 10 is formed by a transparent electrode, and the plurality of finger electrodes 60 provided on the light receiving surface 22 are formed by hard-soldered silver paste. The hard-soldered silver paste encompasses a resin hardened at 200-300° C. Meanwhile, the first type solder layer 52 is provided on the surface of the terminal wiring member 18 on the light receiving surface side. The first type solder layer 52 is formed by a solder having a higher melting point than the second type solder layer 50. For example, the first type solder layer 52 has a tin-silver-copper composition. In that case, the melting point of the first type solder layer 52 is about 220° C. The minimal interval between the terminal wiring member 18 and the 11-st solar cell 10*aa* in the x axis direction is denoted by a first interval D1. Further, the interval between two adjacent finger electrodes 60 in the x axis direction is denoted by a second interval D2. The first interval D1 is 3-5 mm by way of one example, and the second interval D2 is 2 mm by way of one example. In other words, the first interval D1 is configured to be larger than the second interval D2.

The hard-soldered silver paste used in the plurality of finger electrodes 60 contains an additive such as a conductive filler, a binder resin, and a solvent. Metal particles of silver (Ag), copper (Cu), nickel (Ni), etc., or carbon, or a mixture thereof are/is used for the conductive filler. Of these, Ag particles are suitable. It is preferred that the binder resin be a thermosetting resin. The binder resin not hardened yet is in a solid state that is soluble in a solvent or in a liquid or paste state (semisolid state) at room temperature. For example, polyester resin, phenolic resin, polyimide resin, polycarbonate resin, polysulfone resin, melamine resin, epoxy resin, etc. or a mixture thereof is used as the binder resin. Of these, phenolic resin, melamine resin, and epoxy resin are suitable, and epoxy resin is particularly suitable. Further conductive paste A, B contains, as necessary, a hardening agent adapted to the binder resin. Other than the solvent, the additive is exemplified by a rheology conditioner, a plasticizer, a dispersant, a defoamant, etc.

Figure 8B:
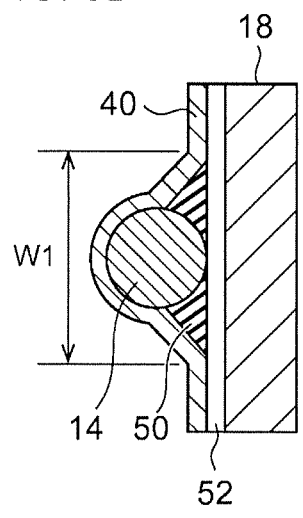
Figure 8C:
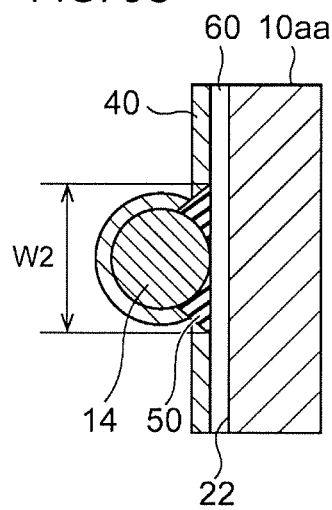
Figure 8D:
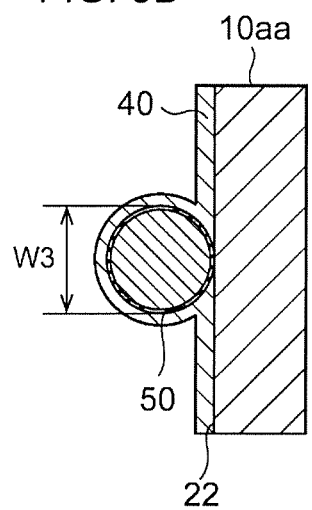

FIG. 8B is a cross-sectional view of a first portion P1 of FIG. 8A, FIG. 8C is a cross-sectional view of a second portion P2 of FIG. 8A, and FIG. 8D is a cross-sectional view of a third portion P3 of FIG. 8A. In these figures, the left side corresponds to the light receiving surface side, and the right side corresponds to the back surface side. The first portion P1 in FIG. 8B is a portion where the wire 14 is connected to the terminal wiring member 18. The first type solder layer 52 is provided on the light receiving surface side of the terminal wiring member 18, and the wire 14 is connected to the first type solder layer 52 by the second type solder layer 50. Further, the first film 40 is provided to cover the first type solder layer 52, the second type solder layer 50, and the wire 14.

The second portion P2 in FIG. 8C is a portion where the wire 14 is connected to the finger electrode 60. The finger electrode 60 is provided on the light receiving surface 22 of the 11-st solar cell 10*aa*, and the wire 14 is connected to the finger electrode 60 by the second type solder layer 50. Further, the first film 40 is provided to cover the finger electrode 60, the second type solder layer 50, and the wire 14. The third portion P3 in FIG. 8D is a portion where the wire 14 is brought into contact with the light receiving surface 22, i.e., the transparent electrode. The wire 14 is connected to the light receiving surface 22 of the 11-st solar cell 10*aa* by the second type solder layer 50. Further, the first film 40 is provided to cover the light receiving surface 22, the second type solder layer 50, and the wire 14.

As mentioned before, the wettability of the finger electrode 60, in which hard-soldered silver paste is used, with the second type solder layer 50 is higher than the wettability of the transparent electrode on the light receiving surface 22. For this reason, the second type solder layer 50 on the transparent electrode is attracted to the finger electrode 60 having a higher wettability as the second type solder layer 50 is melted. As a result, a second width W2 of the second type solder layer 50 in the second portion P2 shown in FIG. 8C in the y axis direction is larger than a third width W3 of the second type solder layer 50 in the third portion P3 shown in FIG. 8D in the y axis direction.

Further, the wettability of the terminal wiring member 18, in which the first type solder layer 52 is used, with the second type solder layer 50 is higher than the wettability of the finger electrode 60 in which hard-soldered silver paste is used. Therefore, the second type solder layer 50 is more attracted to the terminal wiring member 18 than the finger electrode 60 as the second type solder layer 50 is melted. Further, as shown in FIG. 8A, the first interval D1 is configured to be longer than the second interval D2. For this reason, the amount of the second type solder layer 50 attracted by the terminal wiring member 18 is larger than the mount of the second type solder layer 50 attracted by the finger electrode 60. As a result, a first width W1 of the second type solder layer 50 in the first portion P1 shown in FIG. 8B in the y axis direction is larger than the second width W2 shown in FIG. 8C.

To summarize the above, the width of the second type solder layer 50 in the y axis direction is largest in the terminal wiring member 18. The width of the second type solder layer 50 is next largest in the finger electrode 60. Further, the width of the second type solder layer 50 is smallest in the transparent electrode. This improves the bond strength of the wire 14 in the terminal wiring member 18 and in the finger electrode 60. The above description applies to the bridge wiring member 16 as well as to the terminal wiring member 18.

A description will now be given of a method of manufacturing the solar cell module 100. The wire film 90 shown in FIG. 3 is prepared to connect two adjacent solar cells 10. The string 12 is produced by layering the first film 40 of the wire film 90 on one of the two adjacent solar cells 10 and layering the second film 42 of the wire film 90 on the other of the two adjacent solar cells 10. Either the bridge wiring member 16 or the terminal wiring member 18 is attached to the end of the string 12 via the wire 14. A stack is produced by layering the first protection member 30, the first encapsulant 32, the string 12, the bridge wiring member 16 and the terminal wiring member 18, the second encapsulant 34, and the second protection member 36 in the stated order in the positive-to-negative direction along the z axis.

This is followed by a laminate cure process performed for the stack. In this process, air is drawn from the stack, and the stack is heated and pressurized so as to be integrated. In vacuum lamination in the laminate cure process, the temperature is set to about 50-140°, as mentioned before. The temperature is higher than the melting point of the second type solder layer 50 and lower than the melting point of the first type solder layer 52. Further, a terminal box is attached to the second protection member 36 using an adhesive.

According to this embodiment, the finger electrode 60 is formed by hard-soldered silver paste, and the melting point of the first type solder layer 52 is configured to be higher than the melting point of the second type solder layer 50. Therefore, the second type solder layer 50 is more attracted to the bridge wiring member 16 or the terminal wiring member 18 than the finger electrode 60. Further, since the second type solder layer 50 is more attracted to the bridge wiring member 16 or the terminal wiring member 18 than the finger electrode 60, the first width W1 of the second type solder layer 50 in the first portion P1 is configured to be larger than the second width W2 of the second type solder layer 50 in the second portion P2.

Further, since the first interval D1 between the solar cell 10 and the bridge wiring member 16 or the terminal wiring member 18 is configured to be wider than the second interval D2 between two adjacent finger electrodes 60, the amount of the second type solder layer 50 attracted to the bridge wiring member 16 or the terminal wiring member 18 is increased. Further, since the amount of the second type solder layer 50 attracted to the bridge wiring member 16 or the terminal wiring member 18 is increased, the first width W1 of the second type solder layer 50 in the first portion P1 is configured to be larger than the second width W2 of the second type solder layer 50 in the second portion P2. Further, since the first width W1 of the second type solder layer 50 in the first portion P1 is configured to be larger than the second width W2 of the second type solder layer 50 in the second portion P2, the bond strength of the wire 14 in the bridge wiring member 16 or in the terminal wiring member 18 is improved. Since the bond strength of the wire 14 in the bridge wiring member 16 or in the terminal wiring member 18 is improved, the durability is inhibited from being lowered. Since the wire film 90 is used to connect a plurality of solar cells 10, the manufacturing of the solar cell module 100 is made easy.

Further, since the first film 40 extends in the second direction, and the wire 14 is connected to the bridge wiring member 16 or the terminal wiring member 18 such that the wire is sandwiched by the first film 40 and the bridge wiring member 16 or the terminal wiring member 18, the manufacturing of the solar cell module 100 is made easier. Further, since the first type solder layer 52 has a tin-silver-copper composition, and the second type solder layer 50 has a tin-silver-bismuth composition, the melting point of the first type solder layer 52 is configured to be lower than the melting point of the second type solder layer 50.

Further, since the transparent electrode is provided on the light receiving surface 22 of the solar cell 10, it is ensured that the second type solder layer 50 is more attracted to the finger electrode 60 than the transparent electrode. Further, since the second type solder layer 50 is more attracted to the finger electrode 60 than the transparent electrode, the second width W2 is configured to be larger than the third width W3 of the second type solder layer 50 in the third portion P3. Further, since the second width W2 is configured to be larger than the third width W3 of the second type solder layer 50 in the third portion P3, the bond strength of the wire 14 in the finger electrode 60 is improved. Since the bond strength of the wire 14 in the finger electrode 60 is improved, the durability is inhibited from being lowered.

One embodiment of the present disclosure is summarized below. A solar cell module 100 according to an embodiment of the present disclosure includes: a solar cell 10 including a light receiving surface 22 and a back surface 24 that face in opposite directions, a plurality of finger electrodes 60 each extending in a first direction being arranged on the light receiving surface 22 in a second direction intersecting the first direction; a bridge wiring member 16, a terminal wiring member 18 that extends in the first direction at a position more spaced apart from the solar cell 10 in the second direction than an interval between two adjacent finger electrodes 60 in the second direction; a first protection member 30 provided on a side of the light receiving surface 22 of the solar cell 10; a second protection member 36 provided on a side of the back surface 24 of the solar cell 10; a first encapsulant 32, a second encapsulant 34 provided between the first protection member 30 and the second protection member 36 to encapsulate the solar cell 10 and the bridge wiring member 16, the terminal wiring member 18; a first film 40 attached to the light receiving surface 22 of the solar cell 10; and a wire 14 that extends in the second direction so as to be connected to the plurality of finger electrodes 60 such that the wire 14 is sandwiched by the first film 40 and the light receiving surface 22 and to be also connected to the bridge wiring member 16, the terminal wiring member 18. Each of the finger electrodes 60 is formed by hard-soldered silver paste, a melting point of a first type solder layer 52 provided on a surface of the bridge wiring member 16, the terminal wiring member 18 is higher than a melting point of a second type solder layer 50 provided on a surface of the wire, and a first width W1, in the first direction, of the second type solder layer 50 in a first portion P1 where the wire 14 is connected to the bridge wiring member 16, the terminal wiring member 18 is larger than a second width W2, in the first direction, of the second type solder layer 50 in a second portion P2 where the wire 14 is connected to the finger electrode 60.

The first film 40 may extend in the second direction, and the wire 14 may be connected to the bridge wiring member 16, the terminal wiring member 18 such that the wire 14 is sandwiched by the first film 40 and the bridge wiring member 16, the terminal wiring member 18.

The first type solder layer 52 may have a tin-silver-copper composition. The second type solder layer 50 may have a tin-silver-bismuth composition.

A transparent electrode is provided on the light receiving surface 22 of the solar cell 10, and the second width W2 is larger than a third width W3, in the first direction, of the second type solder layer 50 in a third portion P3 where the wire 14 is in contact with the transparent electrode.

Described above is an explanation based on an exemplary embodiment. The embodiment is intended to be illustrative only and it will be understood by those skilled in the art that various modifications to constituting elements and processes could be developed and that such modifications are also within the scope of the present disclosure.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module, comprising:
   a string of a plurality of solar cells including an end solar cell, wherein a direction in which the string of the plurality of solar cells extends is a second direction, and a direction intersecting the second direction is a first direction, the end solar cell includes a light receiving surface and a back surface that face in opposite directions, a plurality of collecting electrodes each extend in the first direction and are arranged on the light receiving surface in the second direction, and the end solar cell is a solar cell positioned at one end of the plurality of solar cells of the string;
   a first type wiring member that extends in the first direction at a position more spaced apart from the end solar cell in the second direction than an interval between two adjacent collecting electrodes of the plurality of collecting electrodes in the second direction, the first type wiring member being positioned on an outside of and away from the string as a bridge wiring member or a terminal wiring member;
   a first protection member provided on a side of the light receiving surface of the end solar cell;
   a second protection member provided on a side of the back surface of the end solar cell;
   an encapsulant;
   a transparent resin film attached to the light receiving surface of the end solar cell; and
   a second type wiring member that extends in the second direction and is connected to the plurality of collecting electrodes of the end solar cell such that the second type wiring member is sandwiched between the transparent resin film and the light receiving surface and is also connected to the first type wiring member, wherein:
   at least one collecting electrode of the plurality of collecting electrodes is formed by conductive paste including a thermosetting resin as a binder resin, and a conductive filler,
   a first type solder is provided on a surface of the first type wiring member and a second type solder is provided on a surface of the second type wiring member,
   a melting point of the first type solder is higher than a melting point of the second type solder,
   wettability of the first type solder provided on the surface of the first type wiring member with the second type solder is higher than wettability of the at least one collecting electrode formed by the conductive paste with the second type solder,
   a first width, in the first direction, of the second type solder in a first portion where the second type wiring member is connected to the first type wiring member is larger than a second width, in the first direction, of the second type solder in a second portion where the second type wiring member is connected to the at least one collecting electrode, and
   the encapsulant is provided between the first protection member and the second protection member to encapsulate the end solar cell, the transparent resin film, the first type wiring member and the second type wiring member.

2. The solar cell module according to claim 1, wherein:
   the transparent resin film extends in the second direction, and
   the second type wiring member is connected to the first type wiring member such that the second type wiring member is sandwiched by the transparent resin film and the first type wiring member.

3. The solar cell module according to claim 1, wherein the first type solder has a tin-silver-copper composition, and
   the second type solder has a tin-silver-bismuth composition.

4. The solar cell module according to claim 1, wherein:
   the light receiving surface of the end solar cell is formed by a transparent electrode,
   the wettability of the at least one collecting electrode formed by the conductive paste with the second type solder is higher than wettability of the transparent electrode with the second type solder, and
   the second width is larger than a third width, in the first direction, of the second type solder in a third portion where the second type wiring member is in contact with the transparent electrode.

5. The solar cell according to claim 1, wherein the second type wiring member is formed by a wire.

6. The solar cell according to claim 1, wherein the at least one collecting electrode is a finger electrode.

7. A solar cell module, comprising:
   a string of a plurality of solar cells including an end solar cell, wherein a direction in which the string of the plurality of solar cells extends is a second direction, and a direction intersecting the second direction is a first direction, the end solar cell includes a light receiving surface and a back surface that face in opposite directions, and a plurality of finger electrodes as collecting electrodes each extend in the first direction and are arranged on the light receiving surface in the second direction, and the end solar cell is a solar cell positioned at one end of the plurality of solar cells of the string;
   a first type wiring member that extends in the first direction at a position more spaced apart from the end solar cell in the second direction than an interval between two adjacent finger electrodes of the plurality of finger electrodes in the second direction, the first type wiring member being positioned on an outside of and away from the string as a bridge wiring member or a terminal wiring member;
   a first protection member provided on a side of the light receiving surface of the end solar cell;
   a second protection member provided on a side of the back surface of the end solar cell;
   an encapsulant; and
   a wire film including a transparent resin film attached to the light receiving surface of the end solar cell and a second type wiring member that is a wire, wherein:
   the second type wiring member extends in the second direction and is connected to the plurality of finger electrodes such that the second type wiring member and the plurality of finger electrodes are sandwiched between the transparent resin film and the light receiving surface and is also connected to the first type wiring member, the light receiving surface of the end solar cell is formed by a transparent electrode, the plurality of finger electrodes are provided on the light receiving surface, at least one finger electrode of the plurality of finger electrodes is formed by conductive paste including a thermosetting resin as a binder resin, and a conductive filler, a first type solder is provided on a surface of the first type wiring member and a second type solder is provided on a surface of the second type wiring member, a melting point of the first type solder is higher than a melting point of the second type solder, wettability of the first type solder provided on the surface of the first type wiring member with the second type solder is higher than wettability of the at least one finger electrode formed by the conductive paste with the second type solder, the wettability of the at least one finger electrode formed by the conductive paste with the second type solder is higher than wettability of the transparent electrode with the second type solder, a first width, in the first direction, of the second type solder in a first portion where the second type wiring member is connected to the first type wiring member is larger than a second width, in the first direction, of the second type solder in a second portion where the second type wiring member is connected to the at least one finger electrode, the second width is larger than a third width, in the first direction, of the second type solder in a third portion where the second type wiring member is in contact with the transparent electrode forming the light receiving surface, and the encapsulant is provided between the first protection member and the second protection member to encapsulate the end solar cell, the transparent resin film, the first type wiring member and the second type wiring member.

8. A solar cell module, comprising:

a string of a plurality of solar cells including an end solar cell wherein a direction in which the string of the plurality of solar cells extends is a second direction, and a direction intersecting the second direction is a first direction, the end solar cell includes a light receiving surface and a back surface that face in opposite directions, and a plurality of collecting electrodes each extend in the first direction and are arranged on the light receiving surface in the second direction, and the end solar cell is a solar cell positioned at one end of the plurality of solar cells of the string;

a first type wiring member that extends in the first direction at a position more spaced apart from the end solar cell in the second direction than an interval between two adjacent collecting electrodes of the plurality of collecting electrodes in the second direction, the first type wiring member being positioned on an outside of and away from the string as a bridge wiring member or a terminal wiring member;

a first protection member provided on a side of the light receiving surface of the end solar cell;

a second protection member provided on a side of the back surface of the end solar cell;

an encapsulant containing; and a wire film including a transparent resin film attached to the light receiving surface of the end solar cell and a second type wiring member that is a wire, wherein the second type wiring member extends in the second direction and is connected to the plurality of collecting electrodes such that the second type wiring member and the plurality of collecting electrodes are sandwiched between the transparent resin film and the light receiving surface and is also connected to the first type wiring member, the light receiving surface of the end solar cell is formed by a transparent electrode, the plurality of collecting electrodes are provided on the light receiving surface, at least one collecting electrode of the plurality of collecting electrodes is formed by conductive paste including a thermosetting resin as a binder resin, and a conductive filler, a first type solder is provided on a surface of the first type wiring member and a second type solder is provided on a surface of the second type wiring member, a melting point of the first type solder is higher than a melting point of the second type solder, a first width, in the first direction, of the second type solder in a first portion where the second type wiring member is connected to the first type wiring member is larger than a second width, in the first direction, of the second type solder in a second portion where the second type wiring member is connected to the at least one collecting electrode, the second width is larger than a third width, in the first direction, of the second type solder in a third portion where the second type wiring member is in contact with the transparent electrode forming the light receiving surface, and the encapsulant is provided between the first protection member and the second protection member to encapsulate the end solar cell, the transparent resin film, the first type wiring member and the second type wiring member.

9. The solar cell module according to claim 8, wherein:

the wire film extends in the second direction, and the second type wiring member is connected to the first type wiring member such that the second type wiring member is sandwiched by the transparent resin film and the first type wiring member.

10. The solar cell module according to claim 8, wherein:

wettability of the first type solder provided on the surface of the first type wiring member with the second type solder is higher than wettability of the at least one collecting electrode formed by the conductive paste with the second type solder, and the wettability of the at least one collecting electrode formed by the conductive paste with the second type solder is higher than wettability of the transparent electrode with the second type solder.

11. The solar cell according to claim 8, wherein the at least one collecting electrode is a finger electrode.

12. The solar cell according to claim 1, wherein:

the encapsulant contains a first encapsulant provided on the side of the light receiving surface of the end solar cell between the first protection member and the transparent resin film and a second encapsulant provided on the side of the back surface of the end solar cell, and a resin film of polyolefin, ethylene-vinyl acetate copolymer (EVA), polyvinyl butyral (PVB), polyimide or a thermosetting resin is used as the first encapsulant, and the transparent resin film is formed by polyethylene terephthalate (PET).

13. The solar cell according to claim 1, wherein:
the encapsulant contains a first encapsulant provided on the side of the light receiving surface of the end solar cell between the first protection member and the transparent resin film and a second encapsulant provided on the side of the back surface of the end solar cell, and
the transparent resin film is formed by polyethylene terephthalate (PET), and a resin film excluding a PET film is used as the first encapsulant.

14. The solar cell according to claim 1, wherein:
the encapsulant contains a first encapsulant provided on the side of the light receiving surface of the end solar cell between the first protection member and the transparent resin film and a second encapsulant provided on the side of the back surface of the end solar cell, and
the first encapsulant contains a resin that is a thermoplastic resin or a thermosetting resin, the resin that is the thermoplastic resin or the thermosetting resin of the first encapsulant is different from a resin of the transparent resin film.

15. The solar cell according to claim 7, wherein:
the encapsulant contains a first encapsulant provided on the side of the light receiving surface of the end solar cell between the first protection member and the transparent resin film and a second encapsulant provided on the side of the back surface of the end solar cell, and
a resin film of polyolefin, ethylene-vinyl acetate copolymer (EVA), polyvinyl butyral (PVB), polyimide or a thermosetting resin is used as the first encapsulant, and the transparent resin film is formed by polyethylene terephthalate (PET).

16. The solar cell according to claim 7, wherein:
the encapsulant contains a first encapsulant provided on the side of the light receiving surface of the end solar cell between the first protection member and the transparent resin film and a second encapsulant provided on the side of the back surface of the end solar cell, and
the transparent resin film is formed by polyethylene terephthalate (PET), and a resin film excluding a PET film is used as the first encapsulant.

17. The solar cell according to claim 7, wherein:
the encapsulant contains a first encapsulant provided on the side of the light receiving surface of the end solar cell between the first protection member and the transparent resin film and a second encapsulant provided on the side of the back surface of the end solar cell, and
the first encapsulant contains a resin that is a thermoplastic resin or a thermosetting resin, the resin that is the thermoplastic resin or the thermosetting resin of the first encapsulant is different from a resin of the transparent resin film.

18. The solar cell according to claim 8, wherein:
the encapsulant contains a first encapsulant provided on the side of the light receiving surface of the end solar cell between the first protection member and the transparent resin film and a second encapsulant provided on the side of the back surface of the end solar cell, and
a resin film of polyolefin, ethylene-vinyl acetate copolymer (EVA), polyvinyl butyral (PVB), polyimide or a thermosetting resin is used as the first encapsulant, and the transparent resin film is formed by polyethylene terephthalate (PET).

19. The solar cell according to claim 8, wherein:
the encapsulant contains a first encapsulant provided on the side of the light receiving surface of the end solar cell between the first protection member and the transparent resin film and a second encapsulant provided on the side of the back surface of the end solar cell, and
the transparent resin film is formed by polyethylene terephthalate (PET), and a resin film excluding a PET film is used as the first encapsulant.

20. The solar cell according to claim 8, wherein:
the encapsulant contains a first encapsulant provided on the side of the light receiving surface of the end solar cell between the first protection member and the transparent resin film and a second encapsulant provided on the side of the back surface of the end solar cell, and
the first encapsulant contains a resin that is a thermoplastic resin or a thermosetting resin, the resin that is the thermoplastic resin or the thermosetting resin of the first encapsulant is different from a resin of the transparent resin film.

21. A solar cell module, comprising:
a string of a plurality of solar cells including an end solar cell, wherein a direction in which the string of the plurality of solar cells extends is a second direction, and a direction intersecting the second direction is a first direction, the end solar cell includes a light receiving surface and a back surface that face in opposite directions, and a plurality of collecting electrodes each extending in the first direction and being arranged on the light receiving surface in the second direction, and the end solar cell is a solar cell positioned at one end of the plurality of solar cells of the string;
a first type wiring member that extends in the first direction at a position more spaced apart from the end solar cell in the second direction than an interval between two adjacent collecting electrodes of the plurality of collecting electrodes in the second direction, the first type wiring member being positioned on an outside of and away from the string as a bridge wiring member or a terminal wiring member;
a first protection member provided on a side of the light receiving surface of the end solar cell;
a second protection member provided on a side of the back surface of the end solar cell;
an encapsulant; and
a second type wiring member that extends in the second direction and is connected to the plurality of collecting electrodes of the end solar cell and is also connected to the first type wiring member, wherein:
at least one collecting electrode of the plurality of collecting electrodes is formed by conductive paste including a thermosetting resin as a binder resin, and a conductive filler, a first type solder is provided on a surface of the first type wiring member and a second type solder is provided on a surface of the second type wiring member, a melting point of the first type solder is higher than a melting point of the second type solder,
wettability of the first type solder provided on the surface of the first type wiring member with the second type solder is higher than wettability of the at least one collecting electrode formed by the conductive paste with the second type solder, and
a first width, in the first direction, of the second type solder in a first portion where the second type wiring member is connected to the first type wiring member is larger than a second width, in the first direction, of the second type solder in a second portion where the second type wiring member is connected to the at least one collecting electrode, and the encapsulant is provided between the first protection member and the second protection member to encapsulate the end solar cell and the first type wiring member and the second type wiring member.

22. The solar cell module according to claim 21, wherein:

the light receiving surface of the end solar cell is formed by a transparent electrode, the wettability of the at least one collecting electrode formed by the conductive paste with the second type solder is higher than wettability of the transparent electrode with the second type solder, and the second width is larger than a third width, in the first direction, of the second type solder in a third portion where the second type wiring member is in contact with the transparent electrode.

* * * * *